US010439720B2

(12) United States Patent
Jou et al.

(10) Patent No.: US 10,439,720 B2
(45) Date of Patent: Oct. 8, 2019

(54) FPC-BASED OPTICAL INTERCONNECT MODULE ON GLASS INTERPOSER

(71) Applicant: ADOLITE INC., Santa Clara, CA (US)

(72) Inventors: Abraham Jou, Fremont, CA (US); Paul Mao-Jen Wu, Taipei (TW)

(73) Assignee: ADOLITE INC., Santa Clara, CA (US)

( * ) Notice: Subject to any disclaimer, the term of this patent is extended or adjusted under 35 U.S.C. 154(b) by 0 days.

(21) Appl. No.: 15/963,014

(22) Filed: Apr. 25, 2018

(65) Prior Publication Data

US 2018/0335583 A1   Nov. 22, 2018

Related U.S. Application Data

(60) Provisional application No. 62/508,940, filed on May 19, 2017, provisional application No. 62/509,892, filed on May 23, 2017.

(51) Int. Cl.
*H04B 10/25* (2013.01)
*G02B 6/42* (2006.01)
(Continued)

(52) U.S. Cl.
CPC ......... *H04B 10/25* (2013.01); *G02B 6/12011* (2013.01); *G02B 6/428* (2013.01);
(Continued)

(58) Field of Classification Search
CPC .............. G02B 6/4214; G02B 6/12011; G02B 6/3652; G02B 6/4206; G02B 6/4212;
(Continued)

(56) References Cited

U.S. PATENT DOCUMENTS 5,282,080 A   1/1994   Scifres et al.
5,416,861 A   5/1995   Koh et al.
(Continued)

FOREIGN PATENT DOCUMENTS

WO   WO 2018/213035 A1   11/2018
WO   WO 2018/213036 A1   11/2018
(Continued)

OTHER PUBLICATIONS

U.S. Appl. No. 15/963,030, Non-Final Office Action dated Oct. 17, 2017.
(Continued)

*Primary Examiner* — Michael P Mooney
(74) *Attorney, Agent, or Firm* — Alston & Bird LLP

(57) ABSTRACT

FPC-based optical interconnect modules with glass interposer connecting a VCSEL laser to a fiber ribbon cable is described. Improved optical coupling between VCSEL/PD and polymer waveguides are achieved by monolithically integrating micro-lenses and waveguides on the rear side of glass interposer and active devices on the front side. The waveguide has a vertical portion at one end of a horizontal trench portion joined by a 45 degree sidewall. A method of fabrication includes: providing a glass interposer, an array of micro lenses and an array of polymer waveguides having 45 degree tapered ends as reflectors on one surface, and depositing a metal layer and patterning the metal layer into transmission lines on the second surface of the glass substrate, growing bonding pillars for flip chip mounting and assembling active optical devices on the second surface of the glass to connect with the transmission lines.

20 Claims, 8 Drawing Sheets

(51) Int. Cl.
*G02B 6/12* (2006.01)
*H04B 10/50* (2013.01)
*H04B 10/67* (2013.01)
*H04J 14/02* (2006.01)
*H05K 1/02* (2006.01)
*H01S 5/022* (2006.01)
*H01S 5/183* (2006.01)
*H05K 1/18* (2006.01)

(52) U.S. Cl.
CPC .......... *H01S 5/02284* (2013.01); *H01S 5/183* (2013.01); *H04B 10/506* (2013.01); *H04B 10/67* (2013.01); *H04J 14/02* (2013.01); *H05K 1/0274* (2013.01); *H01S 5/02292* (2013.01); *H05K 1/189* (2013.01); *H05K 2201/10121* (2013.01); *H05K 2201/10151* (2013.01)

(58) Field of Classification Search
CPC ...... G02B 6/425; G02B 6/4259; G02B 6/428; H04B 10/25; H04B 10/506; H04B 10/67; H04J 14/02; H05K 2201/10121
USPC .............................. 385/14, 88–92, 129–132
See application file for complete search history.

(56) References Cited

U.S. PATENT DOCUMENTS

| | | |
|---|---|---|
| 5,446,814 A | 8/1995 | Kuo et al. |
| 5,485,021 A | 1/1996 | Abe |
| 6,036,956 A | 3/2000 | Jacob et al. |
| 6,049,639 A | 4/2000 | Paniccia et al. |
| 6,052,498 A | 4/2000 | Paniccia |
| 6,243,508 B1 | 6/2001 | Jewell et al. |
| 6,330,377 B1 | 12/2001 | Kosemura |
| 6,393,169 B1 | 5/2002 | Paniccia et al. |
| 6,403,393 B1 | 6/2002 | Adkisson et al. |
| 6,456,765 B1 | 9/2002 | Klocek et al. |
| 6,549,708 B2 | 4/2003 | Worchesky et al. |
| 6,587,605 B2 | 7/2003 | Paniccia et al. |
| 6,731,856 B1 | 5/2004 | Fujita et al. |
| 6,845,184 B1 | 1/2005 | Yoshimura et al. |
| 7,218,809 B2 | 5/2007 | Zhou et al. |
| 7,266,262 B2 | 9/2007 | Ogawa |
| 7,529,439 B2 | 5/2009 | Kim et al. |
| 7,627,204 B1 | 12/2009 | Deane |
| 8,135,248 B2 | 3/2012 | Hodono |
| 9,036,956 B2 | 5/2015 | Tseng et al. |
| 9,086,551 B2 | 6/2015 | Heroux |
| 9,310,575 B2 | 4/2016 | Matsuda |
| 9,341,797 B2 | 5/2016 | Nakagawa et al. |
| 2001/0031109 A1 | 10/2001 | Paniccia et al. |
| 2001/0038737 A1 | 11/2001 | Imada et al. |
| 2002/0018507 A1 | 2/2002 | Deacon |
| 2002/0028045 A1 | 3/2002 | Yoshimura et al. |
| 2002/0036356 A1* | 3/2002 | Teshima .............. H01L 21/2885 257/797 |
| 2002/0114587 A1 | 8/2002 | Golwalkar et al. |
| 2003/0015770 A1 | 1/2003 | Talin et al. |
| 2003/0223673 A1 | 12/2003 | Garito et al. |
| 2004/0109654 A1 | 6/2004 | Feger et al. |
| 2004/0264837 A1 | 12/2004 | Ogawa |
| 2005/0031265 A1 | 2/2005 | Simon et al. |
| 2005/0041906 A1* | 2/2005 | Sugama ............. G02B 6/12002 385/14 |
| 2005/0063636 A1 | 3/2005 | Joyner |
| 2005/0185900 A1 | 8/2005 | Farr |
| 2005/0201707 A1* | 9/2005 | Glebov ................ G02B 6/1221 385/132 |
| 2006/0045418 A1 | 3/2006 | Cho et al. |
| 2008/0031583 A1 | 2/2008 | Ohtsu et al. |
| 2008/0037934 A1 | 2/2008 | Daikuhara et al. |
| 2009/0060526 A1 | 3/2009 | Matsui et al. |
| 2009/0072393 A1 | 3/2009 | Bachman |
| 2009/0202713 A1 | 8/2009 | Pitwon |
| 2009/0218519 A1 | 9/2009 | McLeod |
| 2010/0032853 A1 | 2/2010 | Naitou |
| 2010/0104290 A1 | 4/2010 | Nobuhara et al. |
| 2010/0213561 A1 | 8/2010 | Assefa et al. |
| 2010/0215313 A1 | 8/2010 | Matsuoka et al. |
| 2010/0226655 A1 | 9/2010 | Kim |
| 2011/0030778 A1 | 2/2011 | Takacs et al. |
| 2011/0133063 A1 | 6/2011 | Ji et al. |
| 2011/0229080 A1 | 9/2011 | Bulthuis et al. |
| 2012/0076454 A1 | 3/2012 | Shiraishi |
| 2012/0177381 A1* | 7/2012 | Dobbelaere ............. H01L 21/84 398/139 |
| 2012/0314990 A1 | 12/2012 | Pitwon et al. |
| 2013/0064494 A1 | 3/2013 | Bolle et al. |
| 2013/0182998 A1 | 6/2013 | Andry et al. |
| 2013/0223789 A1 | 8/2013 | Lee |
| 2014/0112616 A1 | 4/2014 | Numata |
| 2014/0140657 A1* | 5/2014 | Shiraishi ................. G02B 6/42 385/14 |
| 2014/0294342 A1 | 10/2014 | Offrein |
| 2014/0321804 A1 | 10/2014 | Thacker et al. |
| 2014/0355931 A1 | 12/2014 | Tummala et al. |
| 2015/0043919 A1 | 2/2015 | Handelman |
| 2015/0117824 A1 | 4/2015 | Wang et al. |
| 2015/0168646 A1 | 6/2015 | Arai |
| 2015/0303649 A1 | 10/2015 | Weber |
| 2015/0333831 A1* | 11/2015 | Lai ......................... H04B 10/50 398/200 |
| 2015/0362673 A1 | 12/2015 | Zheng et al. |
| 2015/0362676 A1 | 12/2015 | Murison et al. |
| 2016/0156999 A1 | 6/2016 | Liboiron-Ladouceur et al. |
| 2016/0178839 A1* | 6/2016 | Tsujita ................ H05K 1/0203 385/14 |
| 2016/0349451 A1 | 12/2016 | Shen et al. |
| 2017/0017042 A1 | 1/2017 | Menard et al. |
| 2017/0230117 A1 | 8/2017 | Li et al. |
| 2018/0149815 A1 | 5/2018 | Heroux et al. |
| 2018/0159627 A1 | 6/2018 | Fazal et al. |
| 2018/0288875 A1 | 10/2018 | Sasaki et al. |
| 2018/0335584 A1 | 11/2018 | Jou et al. |
| 2018/0335585 A1 | 11/2018 | Jou et al. |
| 2018/0335586 A1 | 11/2018 | Jou et al. |
| 2018/0335587 A1 | 11/2018 | Jou et al. |
| 2018/0335588 A1 | 11/2018 | Jou et al. |
| 2018/0335589 A1 | 11/2018 | Jou et al. |
| 2018/0335590 A1 | 11/2018 | Jou et al. |
| 2018/0337111 A1 | 11/2018 | Jou et al. |
| 2018/0337743 A1 | 11/2018 | Jou et al. |

FOREIGN PATENT DOCUMENTS

| | | |
|---|---|---|
| WO | WO 2018/213037 A1 | 11/2018 |
| WO | WO 2018/213038 A1 | 11/2018 |
| WO | WO 2018/213039 A1 | 11/2018 |
| WO | WO 2018/213040 A1 | 11/2018 |
| WO | WO 2018/213041 A1 | 11/2018 |
| WO | WO 2018/213042 A1 | 11/2018 |
| WO | WO 2018/213043 A1 | 11/2018 |
| WO | WO 2018/213044 A1 | 11/2018 |

OTHER PUBLICATIONS

U.S. Appl. No. 15/963,665, Notice of Allowance dated Oct. 3, 2018.
U.S. Appl. No. 15/963,780, Non-Final Office Action dated Oct. 24, 2018.
U.S. Appl. No. 15/964,701, Non-Final Office Action dated Oct. 5, 2018.
WIPO Application No. PCT/US2018/0310336, PCT International Search Report and Written Opinion of the International Searching Authority dated Sep. 19, 2018.
U.S. Appl. No. 15/963,043, Requirement for Restriction-Election dated Feb. 25, 2019.
Chen et al., "Chip-Level 1 2 Optical Interconnects Using Polymer Vertical Splitter on Silieuri Substrate," IEEE PhotonIcs Journal, 6:1-9 (2014).[ Retrieved from the Internet on Jun. 29, 2018 <URL:https://ieeexplore.ieee.org/stamp/stamp.jsp?tp=&arnumber=67.

(56) References Cited

OTHER PUBLICATIONS

Shen et al., "Implementation of Chip-Level Optical Interconnect With Laser and Photodetector Using SOI-Based 3-D Guided-Wave Path", IEEE Photonics Journal, 6:1-9, (2014).
Shen et al., "Chip-Level Optical Interconnects Using Polymer Waveguides Integrated With Laser-PD on Silicon," IEEE Photonics Technology Letters, (27):13, (2015). [Retrieved from the Internet on Mar. 7, 2018 <URL: https://ieeexplore.leee.org/abstract/docu.
U.S. Appl. No. 15/963,043, Requirement for Restriction-Election dated Jun. 29, 2018.
U.S. Appl. No. 15/963,440 Requirement for Restriction-Election dated Jul. 10, 2018.
U.S. Appl. No. 15/963,780, Requirement for Restriction-Election dated Jul. 27, 2018.
U.S. Appl. No. 15/964,889, Non-Final Office Action dated Jun. 27, 2018.
WIPO Application No. PCT/US2018/031328, PCT International Search Report and Written Opinion of the International Searching Authority dated Jul. 26, 2018.
WIPO Application No. PCT/US2018/031331, PCT International Search Report and Written Opinion of the International Searching Authority dated Jul. 26, 2018.
WIPO Application No. PCT/US2018/031332, PCT International Search Report and Written Opinion of the International Searching Authority dated Jul. 26, 2018.
WIPO Application No. PCT/US2018/031333, PCT International Search Report and Written Opinion of the International Searching Authority dated Jul. 26, 2018.
WIPO Application No. PCT/US2018/031334, PCT International Search Report and Written Opinion of the International Searching Authority dated Jul. 26, 2018.
WIPO Application No. PCT/US2018/031335, PCT International Search Report and Written Opinion of the International Searching Authority dated Sep. 12, 2018.
WIPO Application No. PCT/US2018/031338, PCT International Search Report and Written Opinion of the International Searching Authority dated Jul. 31, 2018.
WIPO Application No. PCT/US2018/031343, PCT International Search Report and Written Opinion of the International Searching Authority dated Jul. 31, 2018.
WIPO Application No. PCT/US2018/031345, PCT International Search Report and Written Opinion of the International Searching Authority dated Jul. 26, 2018.
VLASOV "Silicon CMOS-Integrated Nano-Photonics for Computer and Data Communications Beyond 100G," IEEE Communications Magazine, 50(2):s67-s72, (2012).
U.S. Appl. No. 15/963,440, Non-Final Office Action dated Dec. 19, 2018.
U.S. Appl. No. 15/964,889, Final Office Action dated Jan. 2, 2019.
U.S. Appl. No. 15/965,213, Non-Final Office Action dated Jan. 14, 2019.
U.S. Appl. No. 15/963,030, Non-Final Office Action dated Oct. 17, 2018.
U.S. Appl. No. 15/964,889, Notice of Allowance dated Mar. 21, 2019.

* cited by examiner

FPC-BASED OPTICAL INTERCONNECT MODULE ON GLASS INTERPOSER

CROSS REFERENCE TO RELATED APPLICATIONS

This application claims the benefit of U.S. Provisional Patent Applications No. 62/508,940, titled "OPTICAL COUPLING STRUCTURE" filed May 19, 2017, and No. 62/509,892, titled "OPTICAL INTERCONNECT MODULES" filed May 23, 2017, which are incorporated by reference herein in their entirety.

FIELD

Embodiments described herein relate to optical interconnect modules, and more particularly to FPC-based interconnects.

BACKGROUND

Cloud computing, enterprise networks, and data center networks continue to drive increased bandwidth demand of optical waveguides for metro and long haul wires, and also rack-to-rack wires within data centers to 100 Gbps and beyond. Increased bandwidth demand has motivated overall high data transmission speed on entire optical systems.

Optical interconnect techniques continue to gain attention as potential solutions for high-speed data transmission between systems, and over a variety of distances. For example, optical interconnect solutions have been proposed for a number of applications, such as between racks in a data center, between household consumer electronics, and between boards or chips within server systems. Optical interconnects are particularly suitable for adoption within transmitter and receiver systems.

In a conventional optical sub-assembly (OSA) design, a transmitter module incudes a transmission laser, a driver integrated circuit (IC), and a printed circuit board (PCB), while a receiver module includes a photodetector (PD), a trans-impedance amplifier (TIA), and a PCB. The optical path between the transmission laser (commonly a vertical cavity surface emitting laser (VCSEL)) and PD is typically an optical fiber, such as a fiber ribbon and optical waveguides. Complex beam routers including a focusing lens, a prism, and a fiber connector are used to precisely align the optical fiber with the optical path. Mechanical structures including screws, clips, alignment pins and structural housing are commonly used to secure and align the beam routers.

However, an optical interconnect typically requires coupling of fiber assembly and lasers which involves an external lens alignment, adding complexity and energy loss. A less complicated assembly technique is needed to improve efficiency and reduce cost.

SUMMARY

The application discloses FPC-based optical interconnect modules with a glass interposer connecting a VCSEL laser to a fiber ribbon cable. Improved optical coupling between VCSEL/PD and polymer waveguides are achieved by monolithically integrating micro-lenses and waveguides on the rear side of the glass interposer and active devices on the front side of the glass interposer.

In accordance with an embodiment, an optical interconnect apparatus includes: a glass interposer having a first surface and a second surface opposite to each other; a plurality of conductive lines disposed on the first surface of the glass interposer, wherein the plurality of conductive lines are bonded with an active optical device, a driver chip, a receiver; a flexible circuit board including having a first opening is mounted on the first surface of the glass interposer; a first adhesive film on the first surface of the glass interposer covering the plurality of conductive lines; and a plurality of polymer waveguides attached on the second surface of the glass interposer, the plurality of polymer waveguides each comprises a first core structure having a 45 degree tapered end facing the active optical device on the first surface of the glass interposer, and a cladding structure surrounding the first core structure.

In accordance with an embodiment, the optical interconnect may include a micro-lens on the second surface of the glass interposer between the active optical device and the 45 degree tapered end of the first core structure of the polymer waveguide. The micro-lens has a high numerical aperture NA>0.3.

In accordance with an embodiment of the optical interconnect apparatus, the polymer waveguide includes a second core structure on the 45 degree tapered end of and perpendicular to the first core structure. The second core structure is beneath the micro lens.

In accordance with an embodiment, the active optical device is vertical cavity surface emission laser (VCSEL) or a photodiode (PD).

In accordance with an embodiment, the polymer waveguide is bonded to the glass interposer with an adhesive film, an opening in the adhesive film is aligned with the micro-lens to allow light pass.

In accordance with an embodiment, the interposer includes a metal plate made of stainless steel, for example, for mechanical support. The metal plate has openings for light passage.

In accordance with an embodiment, the receiver chip, PD, and VCSEL are located within a periphery of an opening on the flexible circuit board.

In accordance with an embodiment, the first, and second core structures are made of a polymer core material and the cladding structure is made of a polymer cladding material.

In accordance with an embodiment, a refractive index of the polymer core material is larger than a refractive index of the polymer cladding material to provide total internal reflection along optical path.

In accordance with an embodiment, the cladding structure surrounds the tapered surface of the first core structure.

In accordance with an embodiment, the polymer waveguide connects with an optical fiber ribbon cable via a mechanical transport (MT) connector.

In accordance with an embodiment, a method of fabricating an optical interconnect apparatus is disclosed and the method includes: providing a glass substrate having two opposite first and second surfaces; forming an array of micro lenses in the first surface at pre-determined locations; depositing a first adhesive film on the first surface wherein the first adhesive film has openings over the micro lenses; preparing an array of polymer waveguides having 45 degree tapered ends as reflectors; attaching the array of polymer waveguides to the first surface of the glass substrate; aligning the 45 degree tapered ends to the micro lenses; depositing a metal layer on the second surface of the glass substrate; patterning the metal layer into transmission lines as interconnects; growing bonding pillars for flip chip mounting; depositing a second adhesive film on the second surface of glass and removing partly the second adhesive film to expose bonding pillars; and assembling active optical devices on the second surface of the glass to connect with the transmission lines.

In accordance with an embodiment, preparing an array of polymer waveguides includes: providing a temporary substrate as a support; depositing a first polymer cladding layer on the temporary substrate; patterning the first polymer cladding layer into a trench on the temporary substrate and a tapered side wall by applying multiple exposure patterning techniques, wherein patterning the tapered side wall by applying the multiple exposure patterning techniques include exposing different locations of the tapered side wall with a plurality of exposure energy levels, wherein the plurality of exposure energy levels includes keeping light source exposure energy output constant and varying exposure time on the tapered sidewall, or keeping light source exposure energy output constant and varying exposure aperture size; depositing a first core layer on the top cladding layer and filling into the trench and also on top of the tapered side wall; planarizing the first core layer to remove excess first core layer from the top surface of the first polymer cladding layer; depositing a second cladding layer; patterning the second cladding layer to form a vertical cavity aligned with the tapered side wall; depositing a second core layer and filling the vertical cavity; planarizing the second core layer to remove excess of the second core layer from the second cladding layer; and removing the temporary substrate.

In accordance with an embodiment, patterning the trench and the tapered side wall further includes: exposing the horizontal trench in the first polymer cladding layer with a first mask; and exposing the tapered side wall with a second mask.

In accordance with an embodiment, the array of micro lenses are formed monolithically on the first surface of the glass interposer using a high temperature fusing and reflow technique.

BRIEF DESCRIPTION OF THE DRAWINGS

Having thus described some embodiments in general terms, reference will now be made to the accompanying drawings, which are not necessarily drawn to scale.

Figure 1:
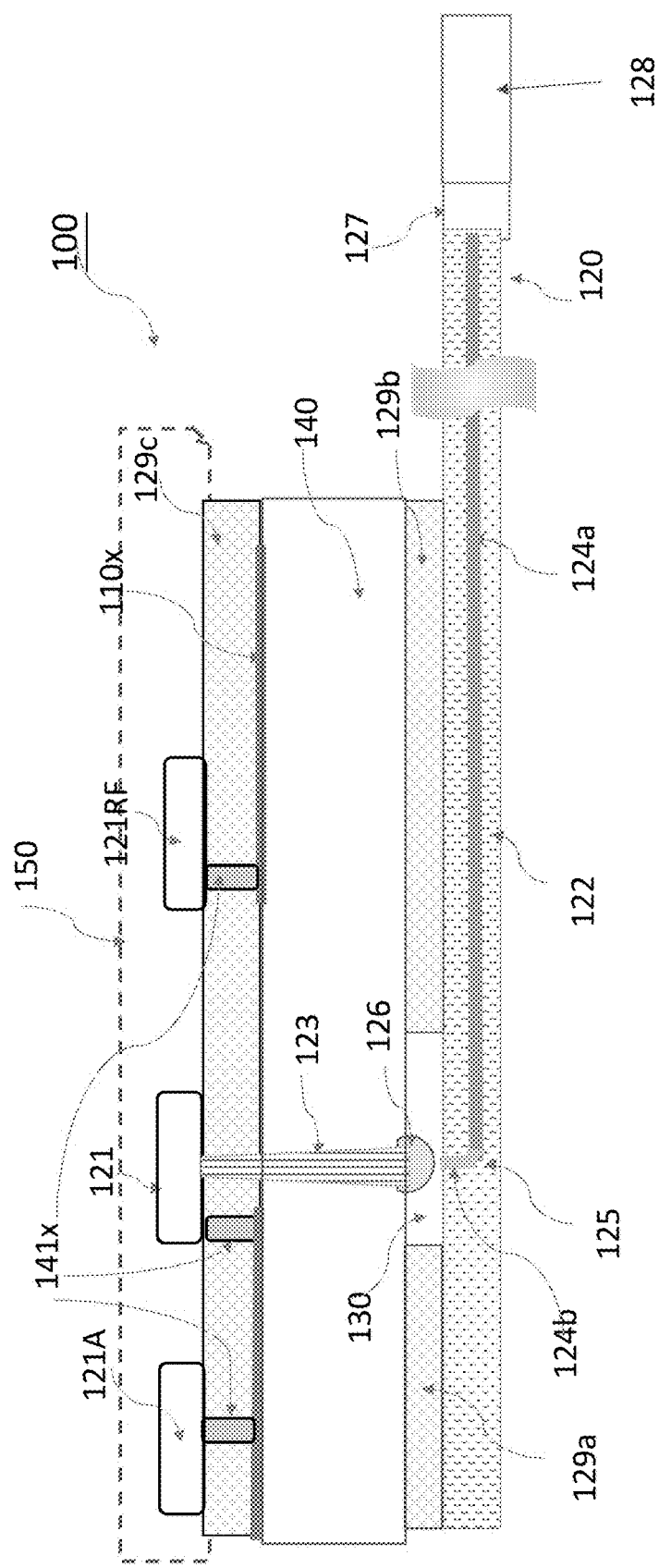

FIG. 1 includes a cross-sectional side view illustrations of a flexible printed circuit (FPC)-based optical interconnect with glass interposer in accordance with an embodiment.

Figure 2:
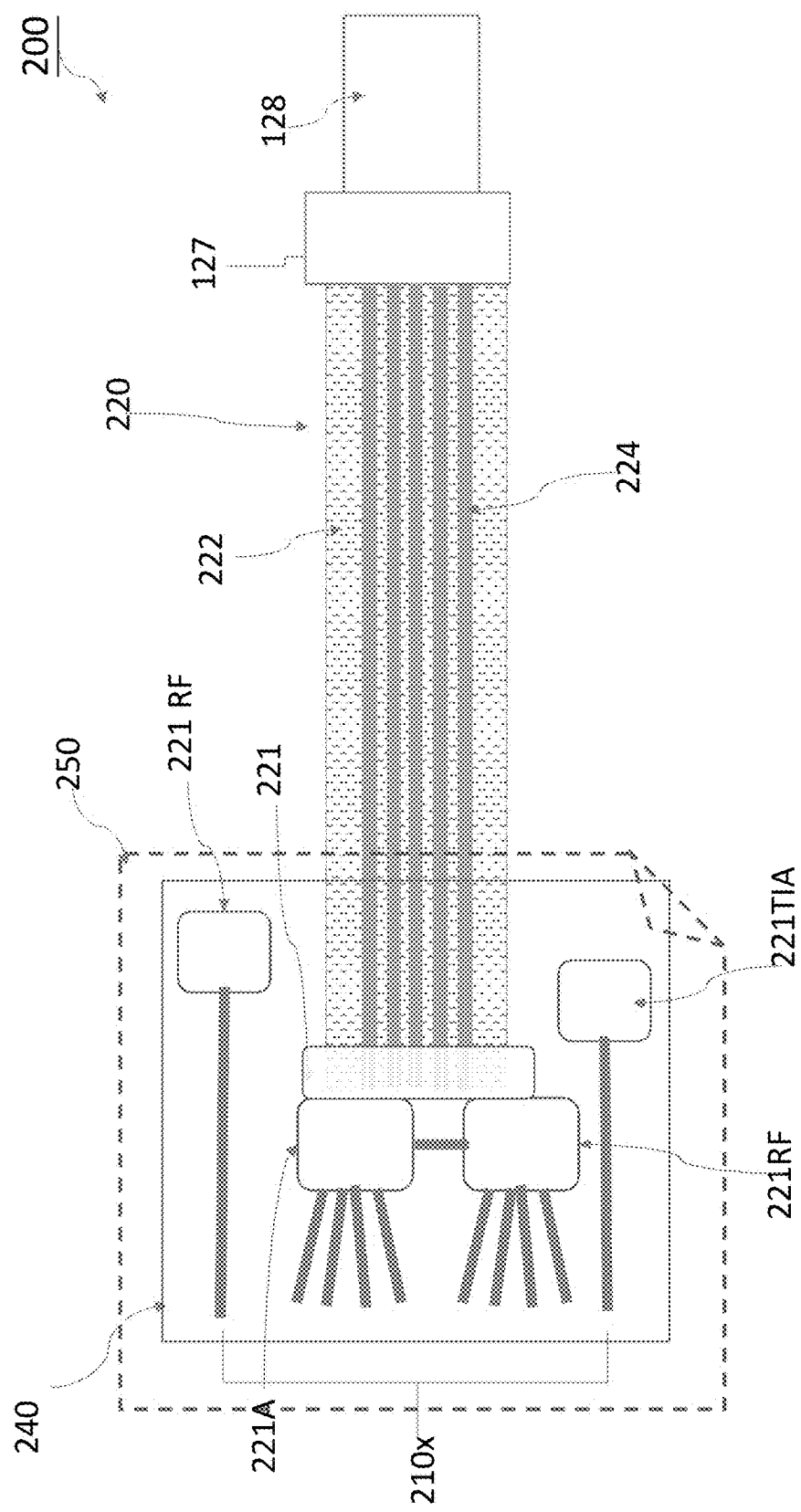

FIG. 2 is a top view illustration of an FPC-based optical interconnect with glass interposer in accordance with an embodiment.

Figure 3A:
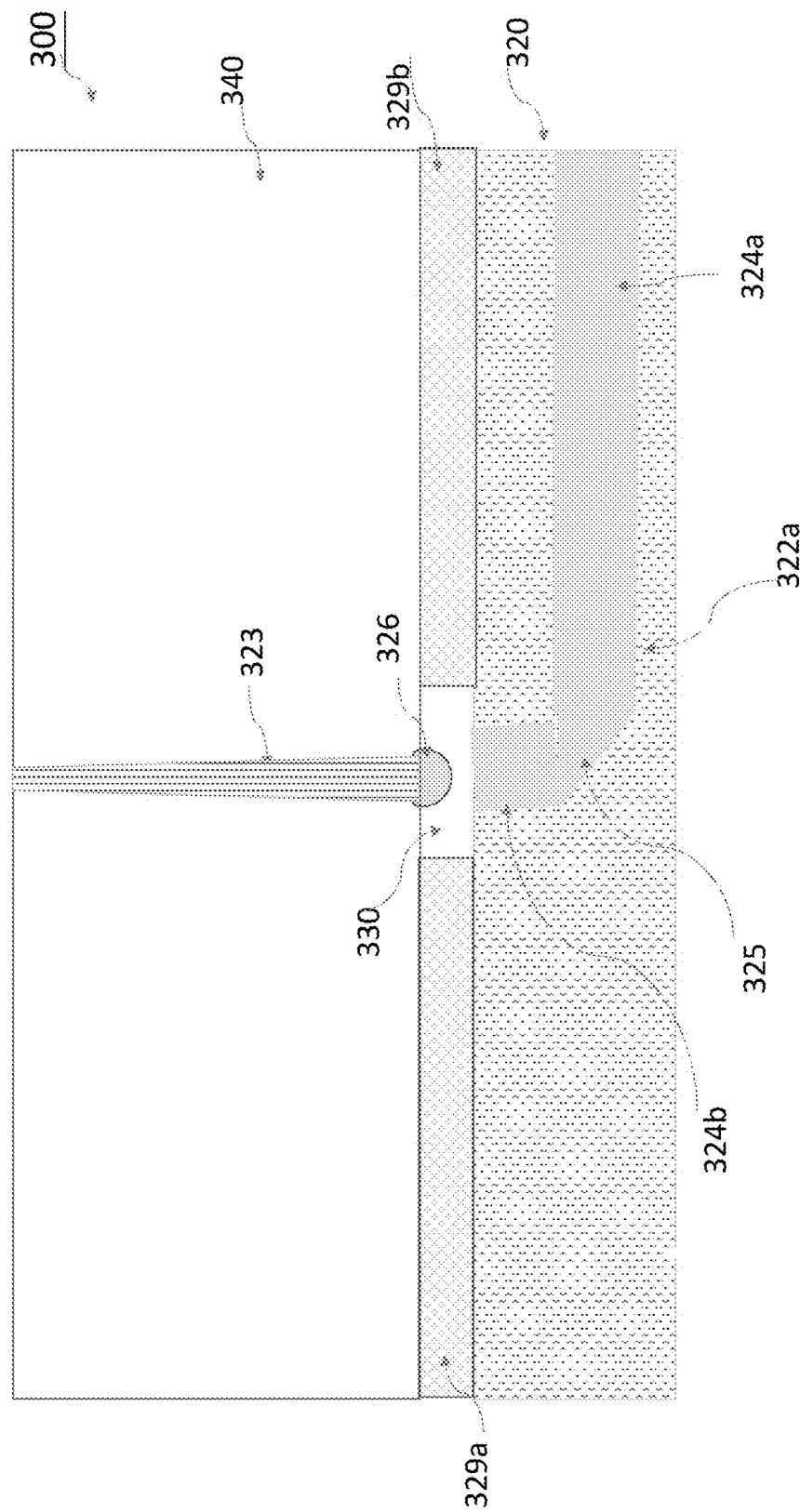

FIG. 3A is a close-up cross-sectional side view showing the micro lens and waveguide having the vertical portion on one side of the glass interposer in accordance with an embodiment.

Figure 3B:
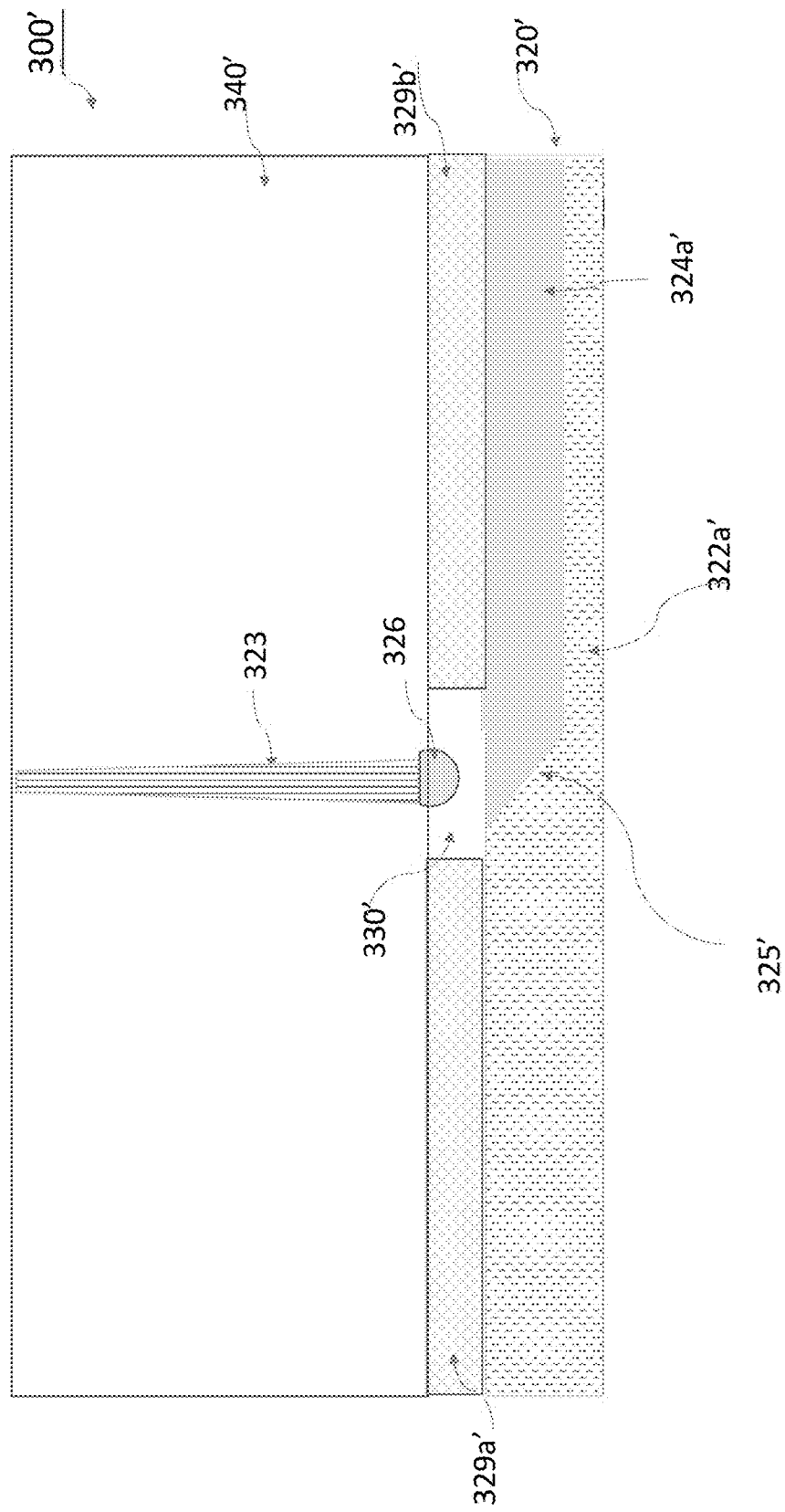

FIG. 3B is a close-up cross-sectional side view showing the micro lens and waveguide without the vertical portion on one side of the glass interposer in accordance with an embodiment.

Figure 4A:
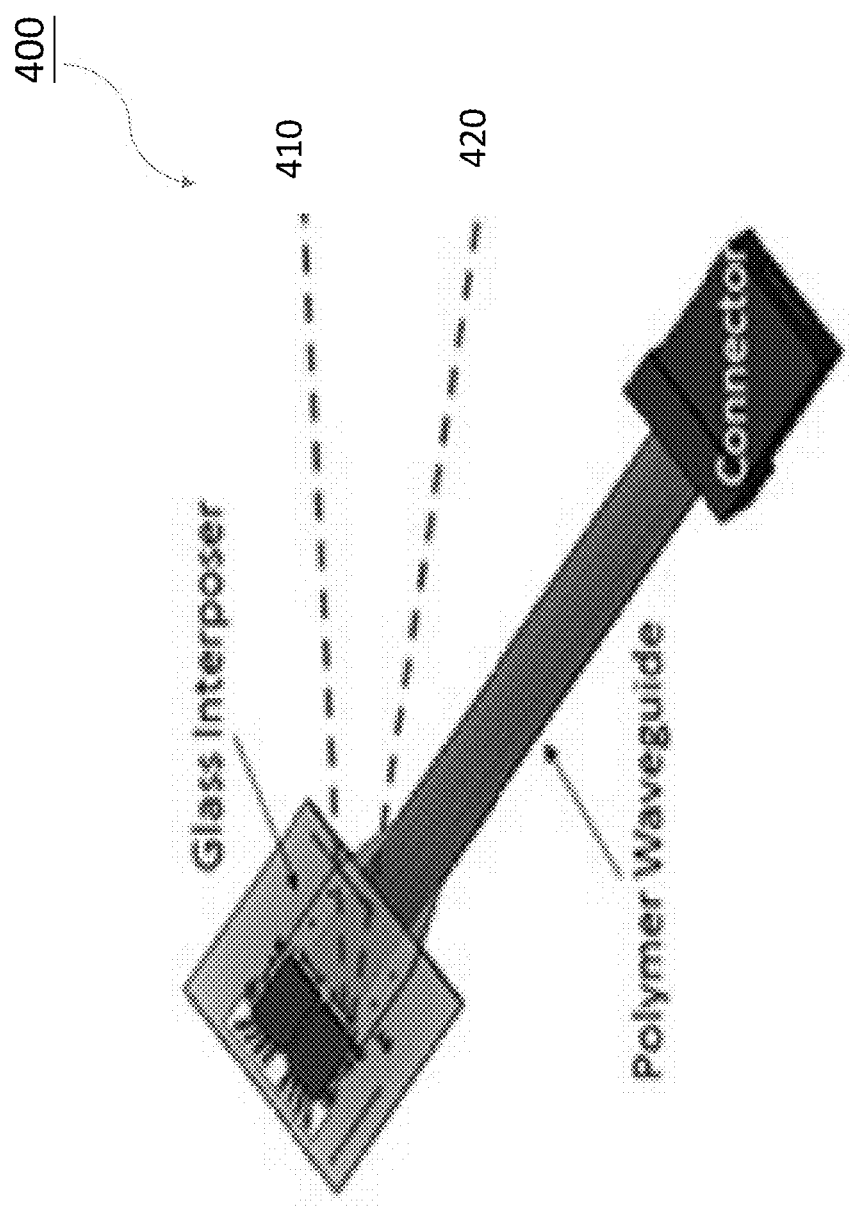

FIG. 4A is isometric view illustration of an exemplary FPC-based optical interconnect device with glass interposer in accordance with an embodiment.

Figure 4B:
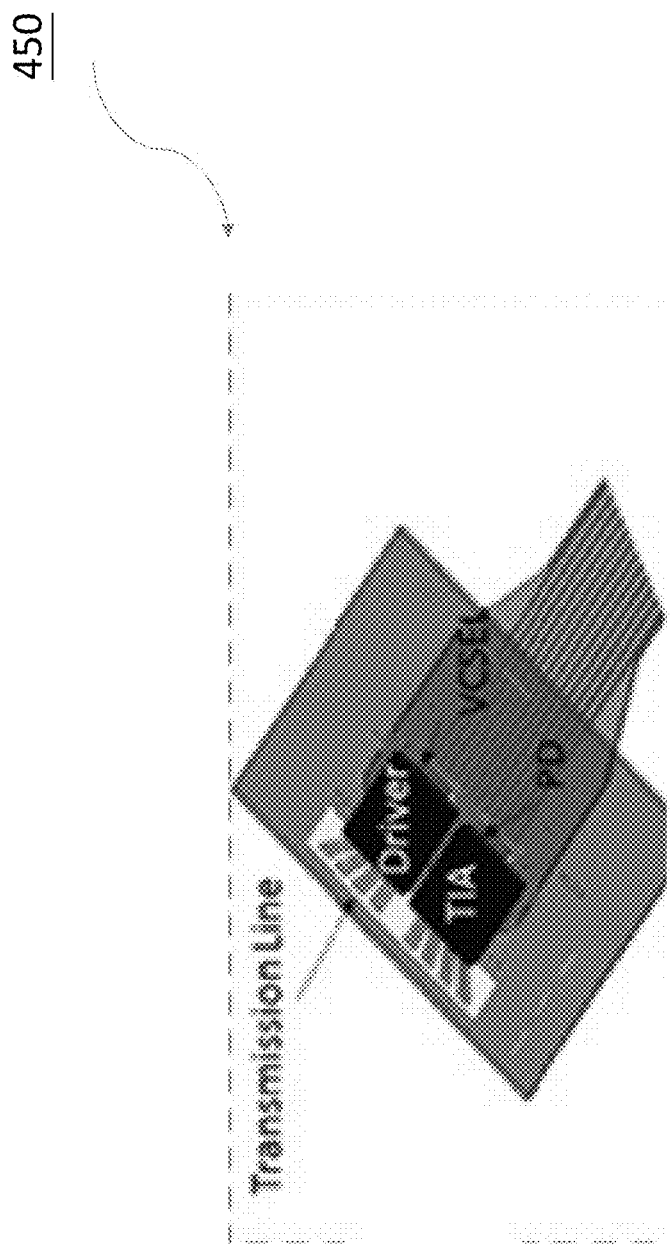

FIG. 4B is a close-up top view illustration of an exemplary FPC-based optical interconnect device with glass interposer at the front end in accordance with an embodiment.

Figure 5A:
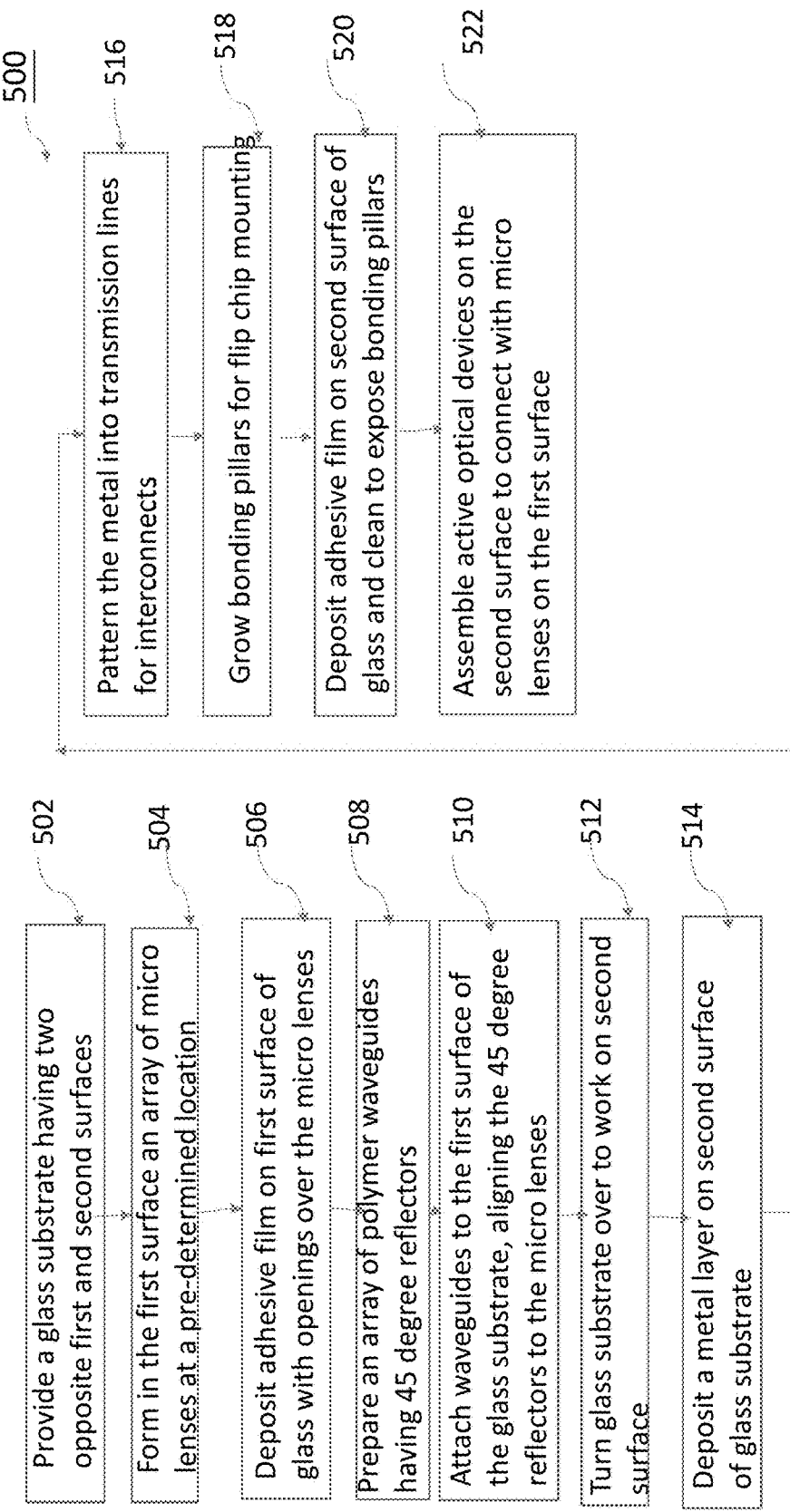

FIG. 5A is a schematic diagram illustrating a fabrication method for making an FPC-based optical interconnect with glass interposer in accordance with an embodiment.

Figure 5B:
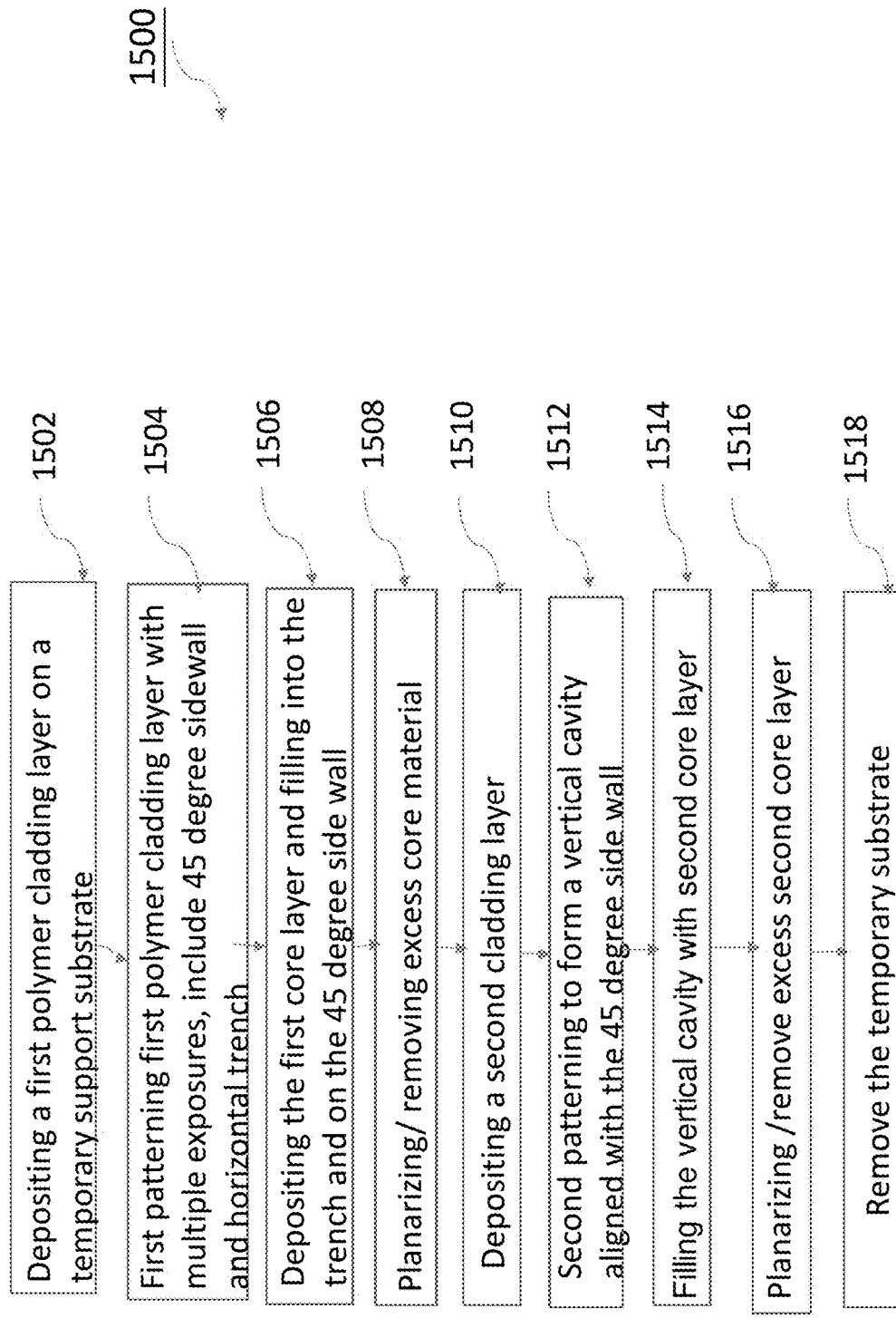

FIG. 5B is a schematic diagram illustrating a fabrication method for making the waveguide with a 45 degree reflector in accordance with an embodiment.

DETAILED DESCRIPTION

The present disclosure is further described below in combination with the drawings and embodiments. It should be understood that, the specific embodiments described herein are merely used to explain the present disclosure rather than limiting the present disclosure. In addition, it should be stated that, in order to facilitate the description, merely a part of structures related to the present disclosure rather than the whole structure are illustrated in the drawings.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

It needs to be noted that, specific details are illustrated in the description below for fully understanding the disclosure. However, the disclosure can be implemented in other ways different from those described herein, and it may be similarly generalized by one skilled in the art without departing from the concept of the disclosure. Therefore, the disclosure will not be limited to the specific embodiments disclosed below.

Optical interconnect is a means of communication by optical fiber cables. Compared to traditional cables, optical fibers are capable of a much higher bandwidth, from 10 Gbit/s to 100 Gbit/s or higher. Optical communication systems often apply a vertical-cavity surface-emitting laser VCSEL for convenient configurations and easy assembling.

The vertical-cavity surface-emitting laser, or VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. Vertical cavity self-emitting laser or VCSEL laser emitting light at wavelengths from 650 nm to 1300 nm are typically based on indium gallium arsenide In(GaAs) wafers with diffraction Bragg reflectors (DBRs) formed from GaAs and aluminum gallium arsenide ($Al_xGa_{(1-x)}As$).

There are now two main methods of restricting the current in a VCSEL characterized by two types of VCSELs: ion-implanted VCSELs and Oxide VCSELs. An additional adhesive layer, such as a non-conductive film (NCF), may also be applied to enhance adhesion of the components. The high speed electrical traces, including the RF devices 221RF, are designed on the waveguide surface to connect the driver IC and VCSEL arrays as well as to connect trans-impedance amplifier (TIA) arrays. Typically a VCSEL array has four VCSEL lasers packed in a row.

In accordance with an embodiment, the data rate of the optical engine can be operated at 28 Giga-bits per second (Gbps) per channel, and can be extended to higher data rates such as 56 Gbps per channel. VCSEL applications include fiber optic communications, precision sensing, computer mice and laser printers. Recent developments of tunable VCSELs with micromechanically (MEMS) movable mirrors have expanded their applications in particular into tunable wavelengths.

Embodiments disclosed below describe optical interconnects and application platforms. In one aspect, the optical interconnects and platforms in accordance with embodiments may be assembled without the optical lenses and fiber ribbons commonly utilized in conventional optical interconnect assemblies. In addition, assembly time can be reduced compared to conventional techniques through use of semiconductor process technologies for the formation of transmission lines and flip chip integration of the active devices such as the driver IC chip, laser, PD, and receiver (e.g. TIA) chip. In addition, the fabrication techniques may allow for improved RF performance of the electrical signals and increased data rates of the optical interconnects. The embodiments illustrated below may be integrated as an FPC-based optical interconnect. In particular, the embodiment may be utilized to improve optical coupling with the VCSEL/PD by monolithically integrating a glass interposer with a VCSEL laser within a FPC, a micro lens and a polymer waveguide.

FIG. 1 includes a cross-sectional side view illustrations of a flexible printed circuit (FPC)-based optical interconnect with glass interposer in accordance with an embodiment. As shown in FIG. 1, the interconnect system 100 includes a central piece glass plate 140. The glass plate 140 may be a glass wafer or a glass substrate that has high transmission quality at the working wavelengths of the optical interconnect device. High transmission quality includes low absorption and low scattering both from the bulk glass plate material and the surfaces at the working wavelengths. The glass plate 140 has two well-polished front and bottom surfaces. The front and bottom surfaces can be parallel or slightly wedged to each other for low optical noise. The thickness of the glass plate 140 is chosen to provide strength to support the optical interconnect device during its process and its long term operation, yet has low transmission loss optically. Typically it is in the range of 50 microns to 2 millimeters.

The front surface of the glass plate 140 carries the active optical devices, electronics, and transmission lines of the optical interconnect. First, electrical traces 110x (transmission lines) are patterned on the clean front surface of the glass plate. Please note that in FIG. 1, not all transmission lines are labeled. Copper, aluminum, tungsten, or alloys are chosen as materials for high speed transmission lines. Metal deposition followed by patterning techniques known in the semiconductor technology is applied in some cases. These techniques include, but not limited to, wet/dry etch, metal plating, or laser writing. Other techniques can also be applied such like, for example, first digging trenches into the glass, second, depositing metal layer on top of the front surface to fill the trenches, and followed by planarization techniques like chemical mechanical polishing (CMP) or selective dry/wet etching to remove metal from outside the trench areas. After patterning transmission lines 110x on the front surface of the glass plate, bonding pillars 141x are soldered on the transmission lines 110x as bumps for connecting to active devices. Again not all bonding bumps are shown as 141x in FIG. 1. Bond structures are formed on the front side of a glass interposer using a variety of semiconductor packaging techniques. For example, the transmission lines and bond pads can be defined by lithography C4 process. An additional underfill layer 129c, formed of insulating materials such as oxide, nitride, or other organics like polymers, polyimide, etc. is deposited on the first surface over the transmission lines 110x to fix or fasten them from the active devices which would be arranged on the top. Another way to insulate maybe to apply a non-conductive film (NCF), over the front surface followed by heating to enhance adhesion of the components. A cleaning process is also applied to expose the bonding pillars 141x for connecting to the active devices.

The active devices 121, such as a vertical cavity surface emission laser (VCSEL) or VCSEL array (for example a standard 1×4 VCSEL), photodetector (PD), driver IC 121A, and receiver chip or trans-impedance-amplifier (TIA) arrays, and RF device 121RF, are flip chip assembled to the bonding pillars 141x on the front side of the glass interposer 140 to form the optical engine. The high speed transmission lines 110x, including the RF device 121RF, are therefore designed on the glass plate 140 to connect the driver IC 121A and VCSEL arrays 121 as well as to connect the receiver chip TIA arrays (not shown in FIG. 1) and other electrical form factors. The glass plate 140 thus turns into the glass interposer 140. In accordance with embodiments, formation of the electrical traces on the glass interposer may lead to improved RF performance of the electrical signals due to the high dielectric constant of the glass interposer material, typically ranging in 3-10 microns. In accordance with an embodiment, the data rate of the optical engine can be operated at 28 Giga-bits per second (Gbps) per channel, and can be extended to higher data rates such as 56 Gbps per channel.

Still referring to FIG. 1, the optical engine is assembled with a flexible printed circuit board 150 (PCB). For example, this may be accomplished using an anisotropic conductive film (ACF) or bump pillars. In an embodiment, the optical engine is assembled within a periphery of an opening in the PCB. While not separately illustrated, such a configuration is compatible with other embodiments, including that described with regard to FIG. 1.

FIG. 2 is a top view illustration of an FPC-based optical interconnect with glass interposer in accordance with an embodiment.

The components on FPC board is better illustrated in area 250 of FIG. 2. Similarly as described above, the front surface of the glass plate 240 carries the active optical devices, electronics, and transmission lines of the optical interconnect. First, electrical traces 210x (transmission lines) are patterned on the clean front surface of the glass plate 240. In FIG. 2, not all transmission lines are labeled. Copper, aluminum, tungsten, or alloys are chosen as materials for high speed transmission lines. Metal deposition followed by patterning techniques known in the semiconductor technology is applied in some cases. These techniques include, but not limited to, wet/dry etch, metal plating, or laser writing. Other techniques can also be applied such like, first making trenches into the glass, second depositing metal layer on top of front surface to fill the trenches, and followed by planarization techniques like chemical mechanical polishing (CMP) or etch to remove metal from outside the trench areas. After transmission lines 210x are patterned on the front surface of the glass plate, bonding pillars with gold or nickel coating are soldered on the transmission lines 210x as bumps for connecting to active devices. Bond structures are formed on the front side of a glass interposer using a variety of semiconductor packaging techniques. For example, the transmission lines and bond pads can be defined by lithography C4 process. An additional adhesive layer (not shown in FIG. 2), formed of insulating materials such as oxide, nitride, or other organics under fills like polymers, polyimide, is deposited on the front surface over the transmission lines 210x to passivate and insulate them from the active devices which would be arranged on the top. The under fill layer plays roles of passivation, insulation, supporting, and planarization, etc. Another way to insulate maybe to apply a non-conductive film (NCF), over the front surface followed by heating to enhance adhesion of the components. A cleaning process is also applied to expose the bonding pillar tops for connecting to the active devices. Adhesion film may include polymers like polyimide layers.

The active devices 221, such as a vertical cavity surface emission laser (VCSEL) or a VCSEL array (for example a standard 1×4 VCSEL), photodetector (PD), driver IC 221A, and receiver chip or trans-impedance-amplifier (TIA) arrays 221TIA, and RF device 221RF, are flip chip assembled to the bonding pillars on the front side of the glass interposer 240 to form the optical engine. The high speed transmission lines 210x, including the RF device 221RF, are therefore designed on the glass interposer 240 to connect the driver IC 221A and VCSEL arrays 221 as well as to connect the receiver chip TIA or arrays 221TIA and other electrical form factors. In FIG. 2, the optical engine is assembled with a printed circuit board 250 (PCB). In an embodiment, the optical engine is assembled within a periphery of an opening in the PCB. While not separately illustrated, such a configuration is compatible with other embodiments, including that described with regard to FIG. 2.

In FIG. 1, on a rear side of the glass interposer 140, as illustrated in FIG. 1, a micro-lens array 126 is formed, which is aligned to an entrance end of a polymer waveguide 120. The micro-lens typically has a high numerical aperture NA>0.3. The optical path is formed from the VCSEL laser to fiber 128 at the exit end of the polymer waveguide 120. The high NA micro-lens array 126 may improve optical coupling between the VCSEL/PD 121 and the polymer waveguides 120. In one embodiment, the micro-lens array 126 is monolithically integrated with the glass interposer 140. Thus, the glass interposer 140 and micro-lens array 126 may be formed of the same layer via a patterning technique. The micro-lens 126 may be shaped by an annealing-reflow process on glass.

The polymer waveguide 120 may be formed separately and attached to the glass interposer 140, using an adhesive layer 129a and 129b, the adhesive layer may be made of a non-conductive film (NCF). In an embodiment, the adhesive layer includes a groove 130 to accommodate the optical path and optional micro-lens array 126. This adhesive film may additionally provide structural configuration for the micro-lens 126.

In accordance with embodiments, VCSEL laser output maybe coupled into a number of channels in multi-channel polymer waveguides for optical communication. The multi-channel polymer waveguides 120 terminated with 45 degree reflectors 125 are designed as optical paths to transmit optical signals from the lasers VCSELs 121 to fiber arrays 128, as well as to receive optical signals from fiber arrays 128 to photodetectors PD arrays 121 in a receiving mode. The polymer-based optical waveguides 120 terminated with 45 degree reflectors 125 may simplify the optical configuration of the module without fiber assembly at the entrance end.

As described in more detail with regard to FIG. 2, the optical interconnect of FIG. 2 may additionally include a printed circuit board PCB 250 with an opening, with the glass interposer 240 bonded to the circuit board such that the driver chip 221A, VCSEL/PD 221, and TIA chip 221TIA, are located within a periphery of the opening.

FIGS. 1 and 2 illustrate such a connector 127 to the fiber arrays 128. In a specific embodiment, the multi-channel polymer waveguides 220 are terminated with a multi-channel mechanical transfer (MT) connector 127, also referred to as a PMT connector when connected with a polymer waveguide, to link with a fiber ribbon cable 128. Thus, the optical interconnect is considered FPC-based. The multi-channel polymer waveguide 120 has a tapered edge on the core layer shown as a 45 degree bending part 125. The optical waveguide 120 may include cladding layer 122 and a horizontal core layer 124a and a vertical core layer 124b both surrounded by the cladding layer 122. Cladding materials in upper and lower cladding layers may be different.

In an embodiment, the polymer waveguides 120 is bonded to the glass interposer 140 with an adhesive film and the adhesive film may be part of a support substrate during the waveguide fabrication process. The waveguides is separated from the part of the support substrate before it is attached to the glass interposer 140.

FIG. 3A is a close-up cross-sectional side view illustration of the optical interconnect showing the micro lens and waveguide on one side of the glass interposer in accordance with an embodiment.

The micro lens array 326 collects output light 323 from VCSEL array and forms an optical path with the entrance of the vertical portion of the waveguide core 324b. The gap 330 in the adhesive layer 329a and 329b is aligned with the micro lens array 326 and the waveguide opening at the end of vertical core 324b. Laser light travels through total internal reflection from the vertical portion 324b to the horizontal portion 324a in the polymer waveguide core, the 45 degree reflector 325 changes light propagation direction by 90 degrees but does not change the total internal reflection. The polymer waveguides 320 may be made separately and are bonded to the glass interposer 340 with adhesive film 329a and 329b, and the adhesive film may be part of a support substrate during the waveguide fabrication process. After the waveguides are separated from the part of the support substrate, it is attached to the glass interposer 340.

In accordance with another embodiment, the polymer waveguide may be in direct contact with the glass interposer, as shown in FIG. 3B. In this embodiment, the polymer waveguide 320' includes a horizontal cladding layer 322a', a horizontal core layer 324a' and a 45 degree reflector portion 325'. However, the waveguide 320' does not include a cladding layer between the core layer and the adhesion film 329a' and 329b' or the glass interposer 340'. The adhesion film is a material having the appropriate dielectric constant to keep light propagate inside the core with total internal reflection. Optical path forms from the VCSEL laser, via the micro lens 326, to the 45 degree reflector and the horizontal waveguide.

FIG. 4A is an isometric view illustration of an exemplary FPC-based optical interconnect device 400 with glass interposer in accordance with an embodiment. Glass interposer forms the support structure for a FPC board 410, micro lens array 420, polymer waveguides, and a connector. Without the glass interposer, a film based FPC maybe too unstable to support the electronic devices and waveguides.

FIG. 4B is a close-up top view of an exemplary FPC-based optical interconnect device 450 with glass interposer without the rear end of the waveguide in accordance with an embodiment. Active optical device VCSEL/PD and electronic devices TIA and Drivers are mounted on top of the glass interposer. Transmission lines are either attached directly to the glass surface by metal-in-trench structures or patterned-lines on the glass surface to guarantee high speed performance.

In accordance with an embodiment, the interposer includes a metal plate made of stainless steel, for example, for mechanical support. The metal plate is not in the figures. The metal plate has openings for light passage.

FIG. 5A is a schematic diagram illustrating a fabrication method for making an FPC-based optical interconnect with glass interposer in accordance with an embodiment.

The fabrication sequence may include first step 502, provide a glass substrate having two opposite first and second surfaces; in step 504, form an array of micro lenses at pre-determined locations in the first surface. The pre-determined locations are beneath the VSCEL array on the other side of the glass interposer. In the next step 506, deposit an adhesive film on the first surface of glass keeping openings over the micro lenses to let light pass; in step 508, prepare an array of polymer waveguides having 45 degree reflectors. In the next step 510, attach waveguides to the first surface of the glass substrate, aligning the 45 degree reflectors to the micro lenses. In step 512, turn glass substrate over to work on the second surface. In the next step 514, deposit a metal layer on the second surface of glass substrate. Another step 516 is to pattern the metal layer into transmission lines as electronic connects. Then perform step 518 to grow bonding pillars coated with gold or nickel for flip-chip mounting. Next step 520 is to deposit another adhesive film on the second surface of glass and polish/clean it to expose the bonding pillars. In step 522, assemble active optical devices on the second surface to connect with transmission lines.

The polymer waveguide having the 45 degree reflector is fabricated following a process disclosed below in FIG. 5B, which is a schematic diagram illustrating a fabrication method for making the waveguide with a 45 degree reflector in accordance with an embodiment.

The fabrication sequence may include first step 1502, depositing a first polymer cladding layer on a temporary substrate, using a suitable technique such as spin coating or spray coating. In a first patterning process 1504, horizontal trenches along the axis of the polymer waveguide are wet/dry etched into the first polymer cladding layer. In accordance with embodiments, the horizontal trench may include a tapered 45 degree sidewall, such that the trench opening that will be closest to the VCSEL/PD and is larger than the opening that connects with the core trench layer. The 45 degree sidewalls will be used as the 45 degree reflectors. Another way of forming the 45 degree sidewall can be achieved by having multiple lithographic exposures on the sidewall side in a separate step from forming the horizontal trench in the last step. The two exposures apply two masks separately at the horizontal trench area and the 45 degree sidewall area. In the making of the slanted 45 degree sidewalls, multiple exposures with varying mask openings can be applied. In the next step 1506, the polymer core layer is then deposited on the first cladding layer, filling the horizontal trenches and the 45 degree sidewall cavities, followed by step 1508, removing the excess core material outside the core trenches and cavities using a planarization technique such as the chemical mechanical polishing (CMP) or a selective wet/dry etch. In the next step 1510 the second cladding layer is deposited over the planarized surface. A second patterning process 1512 in the second cladding layer is performed to form a vertical cavity aligned with each 45 degree side wall reflector to form an optical path with the horizontal waveguide. The next step 1514, filling the vertical cavity with core material. Another planarization process 1516 is then applied to remove the excess core material outside the vertical cavities and provide a flat and clean surface to be the interface between the vertical waveguide and the active optical device exit plane. Like in the previous removal step 1508, a planarization technique such as the chemical mechanical polishing (CMP) or a selective wet/dry etch can be applied to flatten the surface and remove excess core material. When the waveguides are fabricated, perform step 1518 to disengage the temporary substrate if necessary. The temporary substrate can be a silicon wafer, a glass plate, or another form-factor which provides support during process.

However, embodiments are not limited to this particular sequence, and alternative fabrication sequences are envisioned.

In utilizing the various aspects of the embodiments, it would become apparent to one skilled in the art that combinations or variations of the above embodiments are possible for fabricating optical interconnects. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. An optical interconnect apparatus, comprising:
a glass interposer having a first surface and a second surface opposite to each other;
a plurality of conductive lines disposed on the first surface of the glass interposer, wherein the plurality of conductive lines are bonded with an active optical device, a driver chip, a receiver;
a flexible circuit board including a first opening is mounted on the first surface of the glass interposer;
a first adhesive film on the first surface of the glass interposer covering the plurality of conductive lines; and
a plurality of polymer waveguides attached on the second surface of the glass interposer, wherein the plurality of polymer waveguides each comprises a first core structure having a 45 degree tapered end facing the active optical device on the first surface of the glass interposer, and a cladding structure surrounding the first core structure; wherein the cladding structure comprises an under cladding layer between the first core structure and the glass interposer, and an over cladding layer on an external side of the first core structure;
wherein the plurality of polymer waveguides each further comprises a second core structure located on the 45 degree tapered end of and perpendicular to the first core structure.

2. The optical interconnect apparatus of claim 1, wherein the second core structure is beneath a micro lens, and wherein the second core structure comprises a same material as a material of the first core structure.

3. The optical interconnect apparatus of claim 1, wherein the micro-lens is attached on the second surface of the glass interposer between the active optical device and the second core structure of the polymer waveguide.

4. The optical interconnect apparatus of claim 3, wherein the micro-lens has a high numerical aperture NA>0.3.

5. The optical interconnect apparatus of claim 1, wherein the active optical device is a vertical cavity surface emission laser (VCSEL) or a photodiode (PD).

6. The optical interconnect apparatus of claim 1, wherein the glass interposer has a thickness ranging from 50 microns to 2 mm.

7. The optical interconnect apparatus of claim 3, wherein the polymer waveguide is bonded to the glass interposer with a second adhesive film, wherein a second opening in the second adhesive film is aligned with the micro-lens to allow light pass.

8. The optical interconnect apparatus of claim 1, wherein a receiver chip, or a photodiode (PD) or one of vertical cavity surface emission lasers in a VCSEL array are located within a periphery of the first opening on the flexible circuit board.

9. The optical interconnect apparatus of claim 1, wherein the first core structure is made of a polymer core material and the under and over cladding layers are made of a first and a second polymer cladding materials.

10. The optical interconnect apparatus of claim 9, wherein a refractive index of the polymer core material is larger than both refractive indexes of the first and the second polymer cladding materials to provide total internal reflection along optical path.

11. The optical interconnect apparatus of claim 1, wherein the cladding structure surrounds the tapered end of the first core structure.

12. The optical interconnect apparatus of claim 1, wherein the polymer waveguide connects with an optical fiber ribbon cable via a mechanical transport (MT) connector.

13. The optical interconnect apparatus of claim 1, wherein the micro lens is made of polymer, glass or quartz.

14. The optical interconnect apparatus of claim 1, wherein the VCSEL array is a 1×4 array and the optical fiber ribbon cable has 4 channels; wherein the VCSEL array is linked to the conductive lines mounted on the first surface of the glass interposer.

15. The optical interconnect apparatus of claim 1, wherein the glass interposer substrate is a quartz, a bk-7 glass, or a fused silica substrate.

16. The optical interconnect apparatus of claim 1, wherein the first adhesive film is a non-conductive-film (NCF) or a polyimide film.

17. A method of fabricating an optical interconnect apparatus, comprising:
providing a glass substrate having two opposite first and second surfaces;
forming an array of micro lenses in the first surface at pre-determined locations;
depositing a first adhesive film on the first surface wherein the first adhesive film has openings over the micro lenses;
preparing an array of polymer waveguides having 45 degree tapered ends as reflectors;
attaching the array of polymer waveguides to the first surface of the glass substrate;
aligning the 45 degree tapered ends to the micro lenses;
depositing a metal layer on the second surface of the glass substrate;
patterning the metal layer into transmission lines as interconnects;
growing bonding pillars with coating of gold or nickel for flip chip mounting;
depositing a second adhesive film on the second surface of glass and removing partly the second adhesive film to expose bonding pillars; and
assembling active optical devices on the second surface of the glass to connect with the transmission lines;
wherein preparing an array of polymer waveguides comprises:
providing a temporary substrate as a support;
depositing a first polymer cladding layer on the temporary substrate;
patterning the first polymer cladding layer into a trench on the temporary substrate and a tapered side wall by applying multiple exposure patterning techniques, wherein patterning the tapered side wall by applying the multiple exposure patterning techniques include exposing different locations of the tapered side wall with a plurality of exposure energy levels, wherein the plurality of exposure energy levels includes keeping light source exposure energy output constant and varying exposure time on the tapered sidewall, or keeping light source exposure energy output constant and varying exposure aperture size;
depositing a first core layer on the first polymer cladding layer and filling into the trench and also on top of the tapered side wall;
planarizing the first core layer to remove excess first core layer from the top surface of the first polymer cladding layer;
depositing a second cladding layer;
patterning the second cladding layer to form a vertical cavity aligned with the tapered side wall;
depositing a second core layer and filling the vertical cavity;
planarizing the second core layer to remove excess of the second core layer from the second cladding layer; and
removing the temporary substrate.

18. A method of fabricating an optical interconnect apparatus in claim 17, further comprising filling the vertical cavity with a same material as a first core layer material.

19. The method of fabricating an optical interconnect apparatus in claim 17, wherein patterning the trench and the tapered side wall further comprises:
exposing the horizontal trench in the first polymer cladding layer with a first mask; and
exposing the tapered side wall with a second mask.

20. The method of fabricating an optical interconnect apparatus in claim 17, wherein the array of micro lenses are formed monolithically on the first surface of the glass interposer using a high temperature fusing and reflow technique.

* * * * *